United States Patent
Addison et al.

(10) Patent No.: US 12,320,845 B2
(45) Date of Patent: Jun. 3, 2025

(54) HIGH THROUGHPUT SORT

(71) Applicant: Infineon Technologies AG, Neubiberg (DE)

(72) Inventors: David Addison, Bristol (GB); Dyson Wilkes, Marlborough (GB)

(73) Assignee: Infineon Technologies AG, Neubiberg (DE)

( * ) Notice: Subject to any disclaimer, the term of this patent is extended or adjusted under 35 U.S.C. 154(b) by 183 days.

(21) Appl. No.: 18/179,593

(22) Filed: Mar. 7, 2023

(65) Prior Publication Data

US 2024/0302431 A1    Sep. 12, 2024

(51) Int. Cl.
*G01R 31/317*    (2006.01)
*G01R 31/3185*    (2006.01)
*G01R 31/319*    (2006.01)

(52) U.S. Cl.
CPC . *G01R 31/31718* (2013.01); *G01R 31/31703* (2013.01); *G01R 31/31853* (2013.01); *G01R 31/31926* (2013.01)

(58) Field of Classification Search
CPC ........ G01R 31/31718; G01R 31/31703; G01R 31/31853; G01R 31/31926
USPC ............................................. 714/724; 14/724
See application file for complete search history.

(56) References Cited

U.S. PATENT DOCUMENTS

| | | | | |
|---|---|---|---|---|
| 7,277,307 B1* | 10/2007 | Yelluru | ................... | G11C 15/04 |
| | | | | 365/207 |
| 2015/0293208 A1* | 10/2015 | Lee | ......................... | G01S 7/292 |
| | | | | 342/27 |
| 2019/0129002 A1* | 5/2019 | Roger | ................... | G01S 7/2927 |
| 2022/0155368 A1* | 5/2022 | Ramalingam | .......... | G11C 29/20 |

* cited by examiner

*Primary Examiner* — Albert Decady
*Assistant Examiner* — Osman M Alshack
(74) *Attorney, Agent, or Firm* — Eschweiler & Potashnik, LLC (57) ABSTRACT

Systems, methods, and circuitry are provided for a sorting array. In one example, a sorting array element includes an output register and control circuitry. The output register is configured to store an output value. In response to a cell under test (CUT) load signal the output register stores a CUT value and in response to a first register shift signal from a previous sorting array element the output register stores contents of an output register of the previous sorting array element. The control circuitry is configured to generate the CUT load signal and a second register shift signal for a subsequent sorting array element based on relative magnitudes of the CUT value, the output value, and an output value stored in the output register of the previous sorting array element.

19 Claims, 4 Drawing Sheets

HIGH THROUGHPUT SORT

FIELD

The present disclosure relates to the field of hardware-based sorting circuits.

BACKGROUND

Modern microcontrollers support sorting operations using a variety of software and hardware-based techniques.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Many digital signal processors (DSPs) provide one or more sorting operations. These operations are implemented in software and are based on a sorting algorithm, such as a bubble sort. Software-based sorting provides sufficient sorting speeds for many applications. However, in very high speed applications, such as when a complete sort operation is to be performed every clock cycle, software based sorting may not provide sufficient sorting throughput. Modern hardware-based sorting systems also suffer from speed-related limitations.

Figure 1:
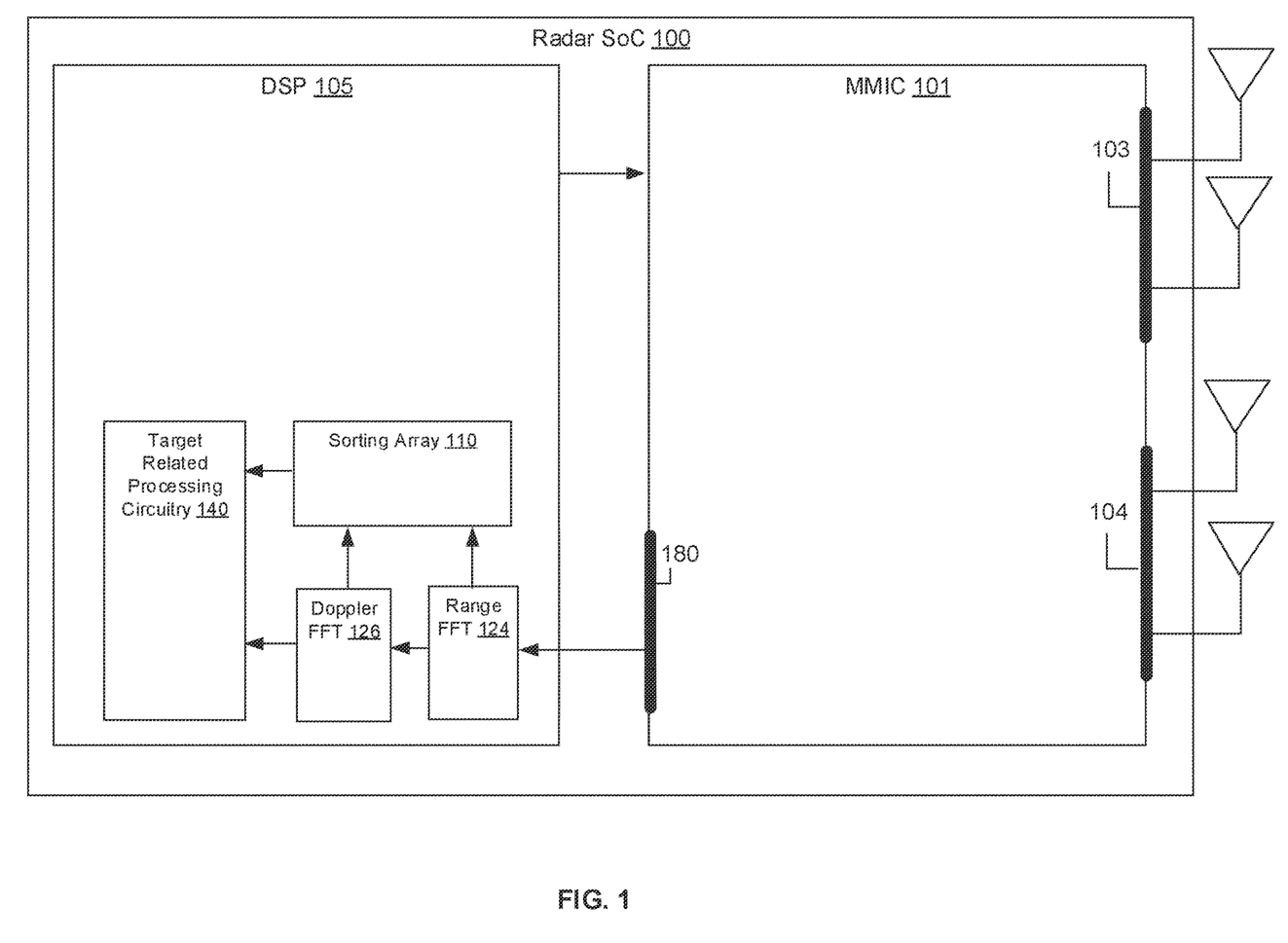
FIG. 1 is a block diagram of an example radar system-on-chip that includes a sorting array, in accordance with various aspects described.

One application that may benefit from high throughput sorting operation is a radar signal processing system-on-chip (SoC). FIG. 1 illustrates an example system-on-chip (SOC) 100 that includes a monolithic microwave integrated circuit (MMIC) 101 and a DSP 105. The MMIC 101 receives a pulse signal (e.g., a saw-tooth or chirp) from the DSP 105, up-converts pulse signal to a radio frequency (RF) radar signal, and transmits the radar signals by way of a transmit interface 103. The MMIC 101 receives radar signals by way of a receive interface 104, down-converts the radar signals, and converts the down-converted signals to a digital radar signal. The digital radar signal is provided to the DSP by way of an MMIC output interface 180.

The digital radar data is processed in sets of bins, each bin containing a sample, and each set of bins being associated with signals received in response to a given radar pulse. The DSP 105 includes a range fast Fourier transform (FFT) stage 124, a Doppler FFT stage 126, and other target-related processing stages (generally 140). The range FFT stage 124 performs an FFT on the digital radar signal values to generate an FFT having FFT values stored in bins. The Doppler FFT stage 126 performs an FFT on the FFT values output by the range FFT stage 124. In one example, a set of 1024 digital radar signal values is processed by each FFT stage for each radar signal pulse. Thus, for each radar signal pulse, an FFT stage will produce 1024 output values or bins. The target-related processing stages 140 perform additional processing on the output of the Doppler FFT stage 126 and other data to detect targets (e.g., provide a range and velocity of the targets). Many other components are included in the MMIC 101 and the DSP 115, but have been omitted for brevity sake Target detection results may be enhanced by providing a median value or other sorted value (e.g., high, low, a certain percentile value, and so on) of the FFT results for each radar pulse to the target-related processing circuitry for use, for example, in deriving a target detection threshold. However, with clock cycles of around 400 MHz, a software-based sorting solution may not provide sufficient sorting speed.

Described herein are methods, systems, and circuitries associated with a sorting array 110 that is capable of sorting values at high speed. The disclosed sorting array may be used in any application (not limited to radar signal processing) that would benefit from high throughput sorting.

Figure 2:
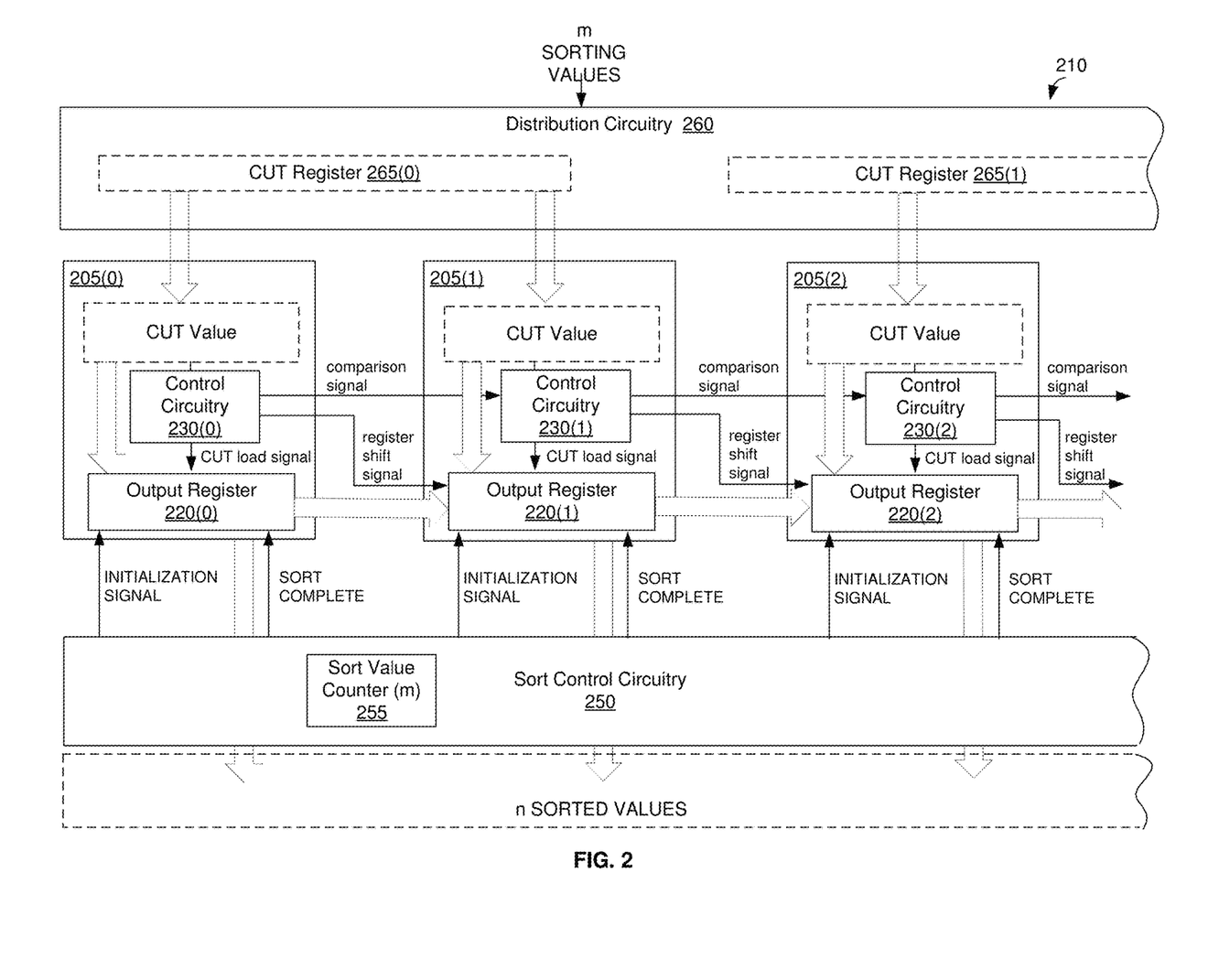
FIG. 2 is a block diagram of a portion of an example sorting array, in accordance with various aspects described.

FIG. 2 is a functional block diagram illustrating a portion of an exemplary sorting array 210. The sorting array 210 includes a chain of n sorting array elements 205 in which adjacent elements are coupled to one another. Three sorting array elements 205(0), 205(1), 205(2) are illustrated in FIG. 2. An additional n-3 elements are coupled to the third sorting array element 205(2). Each sorting array element includes an output register 220 and control circuitry 230. In each clock cycle, the control circuitry 230 in each sorting array element 205 compares the CUT value to an output value stored in the sorting array element's output register 220. Based on these comparisons, each control circuitry 230 either generates a CUT load signal to store the CUT value in the output register, responds to a register shift signal by storing an output value stored in an immediately precedent output register in the output register, or maintains the value in the output register. For example, the control circuitry 230(1) will either maintain the value stored in the output register 220(1), store the CUT value in the output register 220(1), or store the output value stored in output register 220(0) in the output register 220(1) (this last operation is called a register shift operation herein).

At the beginning of each sorting operation on m sorting values (e.g., a set of bin values for FFT results), sort control circuitry 250 controls the sorting elements 205 by providing an initialization signal. The initialization signal causes the sorting array elements to set a value in each output register 220 to an initialization value. In the illustrated example, the initialization value is a maximum possible sorting value.

The sorting array elements are coupled to distribution circuitry 260 that includes one or more cell under test (CUT) registers 265(0), 265(1), and so on. Each CUT register 265 is coupled to one or more of the sorting array elements 205. The distribution circuitry 260 receives successive sorting values (e.g., FFT bin values) and, in each clock cycle, stores a new sorting value in all of the CUT registers 265 to present the CUT value to the sorting array elements. In one example, the distribution circuitry 260 is a registered fan-out tree. While it may take multiple cycles for a sorting value to traverse the fan-out tree to reach the CUT registers 265, a new sorting value is stored in the CUT registers in each clock cycle.

At the end of each clock cycle, the sorting array elements 205 store, in respective output registers 220, sorted values in order. In the disclosed example, the values are stored in order from lowest to highest with the lowest value being stored in the first output register 220(0). A number of output registers will still store the initial (maximum) value depending on the number of values that have been sorted so far. If the number of sorting values (m) exceeds the number of sorting array elements (n), then the sorting array elements will store the lowest n values.

The sort control circuitry 250 includes a sort value counter 255 that counts a number of sorting values that have been processed by the sorting array elements 205 (e.g., presented for processing by being stored in the CUT registers 265). When the counter indicates that m sorting values have been processed, the sort control circuitry 250 provides a sort complete signal to the sorting array elements that causes the sorting array elements 205 to output the value stored in their respective output registers 220 as a set of n sorted values.

Figure 3:
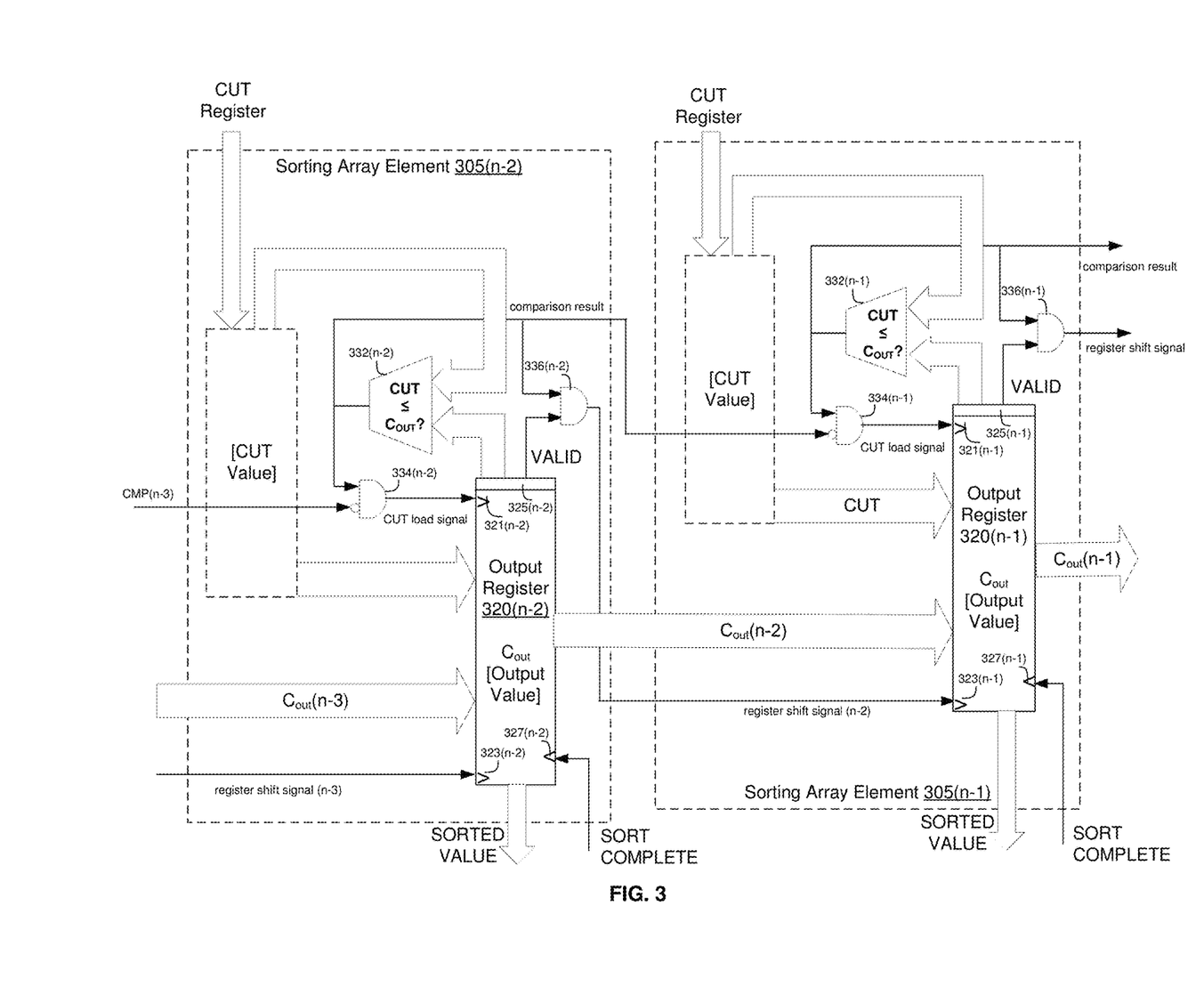
FIG. 3 is a block diagram of two example sorting array elements, in accordance with various aspects described.

FIG. 3 illustrates two exemplary sorting array elements 305(n-2), 305(n-1). The sorting array element 305(n-1) will be described in detail, sorting array element 305(n-2) and the other sorting array elements in the sorting array include analogous components performing analogous operations, which will not be described for the sake of brevity. The sorting array element 305(n-1) includes output register 320(n-1). The output register includes an optional validity bit 325(n-1), a CUT register load input 321(n-1), and register shift input 323(n-1). The validity bit 325(n-1) is set when contents of the output register 320(n-1) are first changed from the initialization value that was set at initialization of the sorting operation. The validity bit 325 may not be necessary for proper sorting, however, as will be described below, the validity bit can avoid unnecessary shifting of initialization values, which are equal to one another, between sorting array elements.

Control circuitry for the sorting array element 305(n-1) includes comparison circuitry 332(n-1), CUT load circuitry 334(n-1), and register shift circuitry 336(n-1). The comparison circuitry 332(n-1) has respective inputs coupled to a CUT register and the output register 320(n-1) and an output coupled to an output register of a subsequent sorting array element (e.g., 320(n) (not shown)). The CUT load circuitry 334(n-1) has respective inputs coupled to the output of the comparison circuitry 332(n-1) and an output of comparison circuitry 332(n-2) of the previous sorting array element 305(n-2) and an output coupled to the CUT register load input 321(n-1) of the output register 320(n-1). In the illustrated example, the CUT load circuitry includes AND logic circuitry and inverter circuitry coupled between an input of the AND logic circuitry and the output of the comparison circuitry 332(n-2) of the previous sorting array element 305(n-2).

The register shift circuitry 336(n-1) has respective inputs coupled to the validity bit 325(n-1) and the output of the comparison circuitry 332(n-1) and an output coupled to an adjacent register shift input 323(n) of an output register 320(n) of the subsequent sorting array element 305(n) (not shown). In the illustrated example, the register shift circuitry includes AND logic circuitry.

Operation of the sorting array and the sorting array element 305(n-1) in particular during one clock cycle will now be described. The output register 320(n-1) stores a value which is either the initial maximum value (with the validity bit not set) or a sorted value. The initialization of the sorting array causes each sorting array element to first store a maximum value, thus unless an error condition has occurred, the output value stored in the output register of a sorting array element will not be greater than the output value stored the output register of any subsequent sorting array elements. Thus it is assumed that the output value stored in output register 320(n-2) is less than or equal to the output value stored in output register (n-1).

At the beginning of the clock cycle, a new CUT value is simultaneously presented to each sorting array element (as indicated by the dashed box). The comparison circuitry 332(n-1) compares the CUT value to a first output value stored in the output register 320(n-1). The comparison circuitry 3322(n-2) compares the CUT value to a second output value stored in the output register 320(n-2). Each comparison circuitry 332 outputs a comparison result that, when set, indicates that the CUT value is less than or equal to the output value stored in the output register. When the CUT value is less than or equal to the first output value stored in the first output register 320(n-1) (and, when used, the validity bit of the output register 320(n-1) is set), the register shift circuitry 336(n-1) outputs a register shift signal to the subsequent sorting array element 305(n) (not shown). This will cause the subsequent sorting array element 305(n) to store the first output value stored in the output register 320(n-1) in the output register 320(n) (not shown). Subsequent sorting array elements will also generate a register shift signal, causing the contents of the output registers in the subsequent sorting array elements to be shifted into an output register of a next subsequent sorting array element. This frees the output register 320(n-1) to store either the CUT value or the second output value stored in the output register 320(n-2) of the preceding sorting array element 305(n-2).

When the CUT value is less than or equal to the first output value stored in the output register 320(n-1) and the CUT value is not less than or equal to the second output value stored in the output register 320(n-2) (e.g., the CUT value lies between the values stored in the output register 320(n-2) and the output register 320(n-1)), the CUT load circuitry 334(n-1) generates a CUT load signal for the output register 320(n-1) (e.g., via input 321(n-1)) that causes the output register 320(n-1) to store the CUT value.

When the output register 320(n-1) receives a register shift signal (e.g., via input 323(n-1) from the preceding sorting array element 305(n-2) (e.g., the CUT value is less than the second output value stored in the output register 320(n-2)), the output register 320(n-1) stores the second output value from the output register 320(n-2) of the preceding sorting array element 305(n-2).

When the output register 320(n-1) receives neither the CUT load signal nor the register shift signal, which means that the CUT value is greater than the first output value, the output register maintains the first output value. This concludes operation of the sorting array element 305(n-1) during a clock cycle.

When the output registers 320 receive the sort complete signal, the output registers output their respective output values as a set of n sorted values representing the lowest n values of the m sorting values that were processed.

Figure 4:
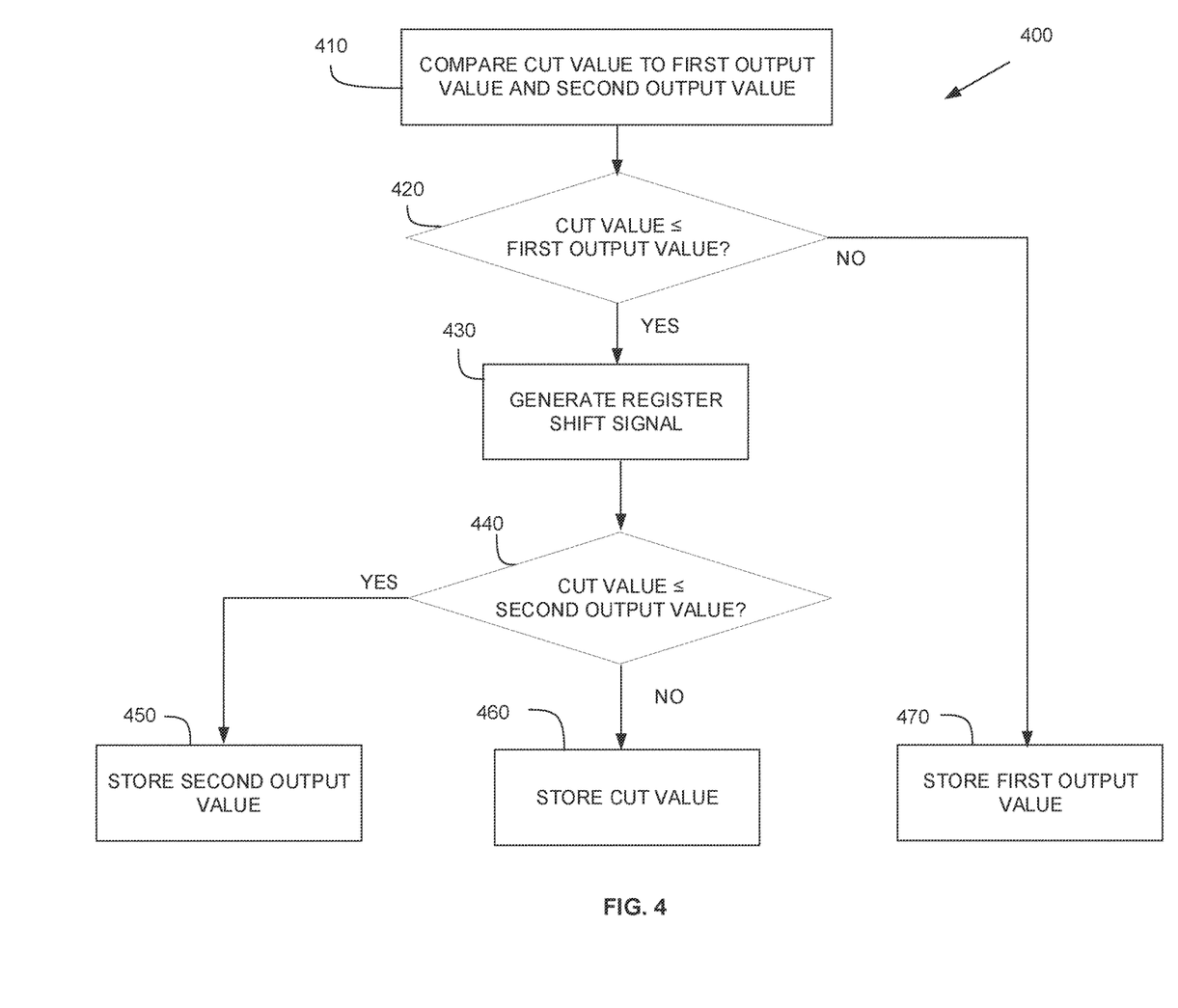
FIG. 4 is a flow diagram outlining an example method for sorting values with a sorting array element of an array of sorting array elements, in accordance with various aspects described.

FIG. 4 is a flow diagram outlining an example method 400 for determining a value for storing in an output register of a sorting array element. At the beginning of the method, a first output value is stored in a first sorting array element having a first output register and a second output value is stored in a second sorting array element having a second output register. The second sorting array element precedes the first sorting array element. The method determines the value that is stored in the first output register based on a comparison between the first output value, the second output value, and the CUT value. The method 400 may be performed, for example, by the sorting array of FIG. 2 and/or FIG. 3.

At 410, a CUT value is compared to the first output value and the second output value. At 420 a determination is made as to whether the CUT value is less than or equal to the first output value. If the CUT value is not less than or equal to the first output value, the method proceeds to 470 and the first output value is stored (e.g., maintained) in the output register. At 430, if the CUT value is less than or equal to the first output value, a register shift signal is generated. The register shift signal is provided to a subsequent sorting array element and causes the first value to be stored in the subsequent sorting array element. At 440, a determination is made as to whether the CUT value is less than or equal to the second output value. If the CUT value is less than or equal to the second output value, at 450 the second output value is stored in the output register (e.g., in response to a register shift signal from the preceding sorting array element). If the CUT value is not less than or equal to the second output value, at 460, the output register stores the CUT value.

While the foregoing description illustrates a sorting array in which the initialization value is a maximum sorting value and the comparison signal is generated when the CUT value is less than or equal to the output value, other example sorting arrays may initialized with a minimum sorting value and provide the comparison signal when the CUT value is greater than or equal to the output value. In this example, the sorting array will store the n highest sorted values of the m sorting values.

It can be seen from the foregoing description that the described systems, circuitries, and methods provide a high throughput sort that scales with a number of array elements and a desired number of sorted values and may sort values at a rate of one comparison per clock cycle, at clock rates of several hundred MHz.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, circuitries, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform margin testing according to embodiments and examples described herein.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

In this description and the appended claims, use of the term "determine" with reference to some entity (e.g., parameter, variable, and so on) in describing a method step or function is to be construed broadly. For example, "determine" is to be construed to encompass, for example, receiving and parsing a communication that encodes the entity or a value of an entity. "Determine" should be construed to encompass accessing and reading memory (e.g., lookup table, register, device memory, remote memory, and so on) that stores the entity or value for the entity. "Determine" should be construed to encompass computing or deriving the entity or value of the entity based on other quantities or entities. "Determine" should be construed to encompass any manner of deducing or identifying an entity or value of the entity.

As used herein, the term identify when used with reference to some entity or value of an entity is to be construed broadly as encompassing any manner of determining the entity or value of the entity. For example, the term identify is to be construed to encompass, for example, receiving and parsing a communication that encodes the entity or a value of the entity. The term identify should be construed to encompass accessing and reading memory (e.g., device queue, lookup table, register, device memory, remote memory, and so on) that stores the entity or value for the entity.

As used herein, the term select when used with reference to some entity or value of an entity is to be construed broadly as encompassing any manner of determining the entity or value of the entity from amongst a plurality or range of possible choices. For example, the term select is to be construed to encompass accessing and reading memory (e.g., lookup table, register, device memory, remote memory, and so on) that stores the entities or values for the entity and returning one entity or entity value from amongst those stored. The term select is to be construed as applying one or more constraints or rules to an input set of parameters to determine an appropriate entity or entity value. The term select is to be construed as broadly encompassing any manner of choosing an entity based on one or more parameters or conditions.

As used herein, the term derive when used with reference to some entity or value of an entity is to be construed broadly. "Derive" should be construed to encompass accessing and reading memory (e.g., lookup table, register, device memory, remote memory, and so on) that stores some initial value or foundational values and performing processing and/or logical/mathematical operations on the value or values to generate the derived entity or value for the entity. "Derive" should be construed to encompass computing or calculating the entity or value of the entity based on other quantities or entities. "Derive" should be construed to encompass any manner of deducing or identifying an entity or value of the entity.

Various illustrative logics, logical blocks, modules, circuitries, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuit, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include field gates, logical components, hardware encoded logic, register transfer logic, one or more processors therein to execute software and/or firmware that confer(s), at least in part, the functionality of the electronic components.

It will be understood that when an element is referred to as being "coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. As used herein the term "or" includes the option of all elements related by the word or. For example A or B is to be construed as include only A, only B, and both A and B. Further the phrase "one or more of" followed by A, B, or C is to be construed as including A, B, C, AB, AC, BC, and ABC

What is claimed is:
1. A sorting array element, comprising:
   an output register configured to store an output value, wherein in response to a cell under test (CUT) load signal the output register stores a CUT value and wherein in response to a first register shift signal received from a previous sorting array element, the output register stores a previous sorting array element output value comprising an output value stored in an output register of the previous sorting array element; and
   control circuitry configured to
      receive a first comparison signal from the previous sorting array element, the first comparison signal indicative of a result of a comparison between the CUT value and the previous sorting array element output value; and
      generate a second comparison signal indicative of a result of a comparison of the CUT value to the output value; and
      generate the CUT load signal and a second register shift signal for a subsequent sorting array element based on the first comparison signal and the second comparison signal.
2. The sorting array element of claim 1, wherein the control circuitry comprises
   comparison circuitry configured to
      compare the CUT value with the output value to generate the first comparison signal, and
      provide the first comparison signal to control circuitry of the subsequent sorting array element;
   CUT load circuitry configured to
      receive the second comparison signal from the previous sorting array element, and
      generate the CUT load signal when the first comparison signal indicates that the CUT value is less than or equal to the output value and the second comparison signal indicates that the CUT value is not less than or equal to the previous sorting array element output value; and
   a register shift circuitry configured to
      generate the second register shift signal when the first comparison signal indicates that the CUT value is less than or equal to the output value, and
      provide the second register shift signal to an output register of a subsequent sorting array element.
3. The sorting array element of claim 2, wherein the register shift circuitry is configured to generate the second register shift signal when a validity bit of the output register is set.

4. The sorting array element of claim 3, wherein the output register is configured to set the validity bit when contents of the output register are first changed from an initialization value.

5. The sorting array element of claim 1, wherein the output register is configured to set the output value to a maximum value in response to an initialization value.

6. The sorting array element of claim 1, wherein the output register is configured to output the output value as a sorted value in response to a sort complete signal.

7. A sorting array for sorting a plurality of sorting values by magnitude, comprising:
   a plurality of sorting array elements;
   wherein each of the sorting array elements comprises
      an output register configured to store an output value, wherein in response to a cell under test (CUT) load signal the output register stores a CUT value, and wherein in response to a first register shift signal being received from a previous sorting array element in the plurality of sorting array elements, the output register stores a previous sorting array element output value comprising an output value stored in an output register of the previous sorting array element; and
      control circuitry configured to
      receive a first comparison signal from the previous sorting array element, the first comparison signal indicative of a result of a comparison between the CUT value and the previous sorting array element output value; and
      generate a second comparison signal indicative of a result of a comparison of the CUT value to the output value; and
      generate the CUT load signal and a second register shift signal for a subsequent sorting array element in the plurality of sorting array elements based on the first comparison signal and the second comparison signal.

8. The sorting array of claim 7, wherein the control circuitry comprises
   comparison circuitry configured to
      compare the CUT value with the output value to generate the first comparison signal, and
      provide the first comparison signal to control circuitry of the subsequent sorting array element;
   CUT load circuitry configured to
      receive the second comparison signal from the previous sorting array element, and
      generate the CUT load signal when the first comparison signal indicates that the CUT value is less than or equal to the output value and the second comparison signal indicates that the CUT value is not less than or equal to an output value of the previous sorting array element output value; and
   a register shift circuitry configured to
      generate the second register shift signal when the first comparison signal indicates that the CUT value is less than or equal to the output value; and
      provide the second register shift signal to an output register of a subsequent sorting array element.

9. The sorting array of claim 8, wherein the register shift circuitry is configured to generate the second register shift signal when a validity bit of the output register is set.

10. The sorting array of claim 7, further comprising distribution circuitry comprising one or more CUT registers, wherein each CUT register is configured to store a received sorting value as the CUT value, further wherein each CUT register is coupled to one or more sorting array elements.

11. The sorting array of claim 7, further comprising sort control circuitry configured to, in response to a previous set of sorting values being sorted, generate an initialization signal that causes respective output registers to reset to a maximum value.

12. The sorting array of claim 7, further comprising sort control circuitry configured to generate a sort complete signal when each sorting value in a set of sorting values has been processed by the sorting array elements, further wherein in response to the sort complete signal, respective output registers of the plurality of sorting array elements output respective output values as sorted values.

13. The sorting array of claim 7, comprising fewer than sorting array elements than a number of sorting values in the plurality of sorting values.

14. A method, comprising:
   in a first comparison, comparing a cell under test (CUT) value with a first output value stored in an output register of a first sorting array element;
   in a second comparison, comparing the CUT value with a second output value stored in an output register of a second sorting array element, wherein the second sorting array element is disposed before the first sorting array element in a sorting array; and
   when the CUT value falls between the first output value and the second output value, storing the CUT value in the output register of the first sorting array element;
   when the CUT value is less than or equal to the second output value, storing the second output value in the output register of the first sorting array element; and
   when the CUT value is greater than the first output value, maintaining the first output value in the output register of the first sorting array element.

15. The method of claim 14, wherein the first comparison and the second comparison are performed in parallel.

16. The method of claim 14, comprising
   generating a register shift signal when the CUT value is less than or equal to the first output value; and
   providing the register shift signal to a third sorting array element, wherein the third sorting array element is disposed after the first sorting array element in the sorting array.

17. A sorting array element, comprising:
   a cell under test (CUT) register configured to store a CUT value;
   an output register coupled to the CUT register and an output register of a previous sorting array element, the output register comprising
      a validity bit, CUT register load input, and a register shift input, wherein the CUT register load input, when enabled, causes a CUT value to be loaded into the output register and the register shift input, when enabled, causes an output value stored in the output register of the previous sorting array element to be loaded into the output register;
   comparison circuitry comprising
      respective inputs coupled to the CUT register and the output register, and
      an output coupled to an output register of a subsequent sorting array element;
   CUT load circuitry comprising
      respective inputs coupled to the output of the comparison circuitry and an output of comparison circuitry of the previous sorting array element, and
      an output coupled to the CUT register load input of the output register; and
   register shift circuitry comprising respective inputs coupled to the validity bit and the output of the comparison circuitry, and an output coupled to an adjacent register shift input of an output register of the subsequent sorting array element.

18. The sorting array element of claim 17, wherein the CUT load circuitry comprises AND logic circuitry and inverter circuitry coupled between an input of the AND logic circuitry and the output of the comparison circuitry of the previous sorting array element.

19. The sorting array element of claim 17, wherein the register shift circuitry comprises AND logic circuitry.

* * * * *